United States Patent
Li et al.

(10) Patent No.: US 11,152,263 B2
(45) Date of Patent: Oct. 19, 2021

(54) PROCESS METHOD FOR CUTTING POLYSILICON GATE OF FINFET TRANSISTOR

(71) Applicant: Shanghai Huali Integrated Circuit Corporation, Shanghai (CN)

(72) Inventors: Jhencyuan Li, Shanghai (CN); Yingju Chen, Shanghai (CN); Liyao Liu, Shanghai (CN); Chanyuan Hu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 16/901,571

(22) Filed: Jun. 15, 2020

(65) Prior Publication Data
US 2021/0118741 A1 Apr. 22, 2021

(30) Foreign Application Priority Data
Oct. 17, 2019 (CN) .......................... 201910986169.1

(51) Int. Cl.
*H01L 21/8234* (2006.01)
*H01L 29/78* (2006.01)
(Continued)

(52) U.S. Cl.
CPC ................ *H01L 21/823437* (2013.01); *H01L 21/76229* (2013.01); *H01L 21/823431* (2013.01); *H01L 21/823481* (2013.01); *H01L 27/0886* (2013.01); *H01L 29/66795* (2013.01); *H01L 29/7851* (2013.01)

(58) Field of Classification Search
CPC .......... H01L 21/02532; H01L 21/0271; H01L 21/0332; H01L 21/28035; H01L 21/3081; H01L 21/32; H01L 21/32055; H01L 21/823431; H01L 21/823437; H01L 27/0886; H01L 29/4236; H01L 29/4238; H01L 29/66795; H01L 29/6681; H01L 29/785; H01L 29/7851; H01L 21/76229
See application file for complete search history.

(56) References Cited

U.S. PATENT DOCUMENTS

| | | | |
|---|---|---|---|
| 2016/0148935 A1* | 5/2016 | Chen | H01L 27/0924 257/369 |
| 2016/0300755 A1* | 10/2016 | Gan | H01L 21/7684 |

(Continued)

*Primary Examiner* — Joseph C. Nicely
(74) *Attorney, Agent, or Firm* — Banner & Witcoff, Ltd.

(57) ABSTRACT

This disclosure discloses a process method for cutting a polysilicon gate of a FinFET transistor, comprising: step 1, forming a fin and a first groove in a polysilicon gate formation region and forming a second groove in a non-polysilicon gate region; step 2, performing filing with a first insulating layer; step 3, performing definition by using a second photomask opposite to a first photomask that defines a polysilicon gate cutting region, and forming a first mask on the top of the first insulating layer in the second groove; step 4, performing etching-back of the first insulating layer to define the height of the fin; step 5, forming a polysilicon gate; and step 6, after the polysilicon gate cutting region is opened by using the first photomask, performing polysilicon etching to achieve cutting of the polysilicon gate. In the present disclosure, the process window is enlarged, thereby increasing the product yield.

15 Claims, 8 Drawing Sheets

(51) Int. Cl.
*H01L 21/762* (2006.01)
*H01L 27/088* (2006.01)
*H01L 29/66* (2006.01)

(56) References Cited

U.S. PATENT DOCUMENTS

| | | | |
|---|---|---|---|
| 2018/0082846 A1* | 3/2018 | Yang | H01L 29/66795 |
| 2018/0138092 A1* | 5/2018 | Lee | H01L 21/823437 |
| 2018/0261514 A1* | 9/2018 | Xie | H01L 29/517 |
| 2019/0035785 A1* | 1/2019 | Ching | H01L 21/823481 |
| 2019/0157387 A1* | 5/2019 | Wu | H01L 21/76224 |
| 2019/0164882 A1* | 5/2019 | Chen | H01L 23/481 |
| 2019/0386002 A1* | 12/2019 | Wu | H01L 29/0649 |
| 2020/0105604 A1* | 4/2020 | Lin | H01L 21/02164 |
| 2021/0098309 A1* | 4/2021 | Min | H01L 21/823481 |

* cited by examiner

PROCESS METHOD FOR CUTTING POLYSILICON GATE OF FINFET TRANSISTOR

CROSS-REFERENCE TO RELATED APPLICATIONS

The present application claims priority to and the benefit of Chinese Patent Application No. CN 201910986169.1 filed on Oct. 17, 2019, the disclosure of which is incorporated herein by reference in its entirety as part of the present application.

TECHNICAL FIELD

The disclosure relates to the field of manufacturing of semiconductor integrated circuits, in particular to a process method for cutting a polysilicon gate of a FinFET transistor.

BACKGROUND

In the existing processes for logic chips of FinFET transistors, the height of the polysilicon gate needs to be increased to satisfy the requirements of subsequent processes. The increase in the height of the polysilicon gate may result in an insufficient window during the polysilicon gate cutting process, which may incur subsequent component short-circuit problems. FIGS. 1A and 1B are schematic diagrams of a device structure in each step of the existing process method for cutting a polysilicon gate of a FinFET transistor. The existing process method for cutting a polysilicon gate of a FinFET transistor comprises the following steps.

Step 1, as shown in FIG. 1A, a semiconductor substrate 101 is provided, the semiconductor substrate 101 comprising a polysilicon gate formation region 102 and a non-polysilicon gate region 103 thereon.

A plurality of fins 104 are formed in the polysilicon gate formation region 102 by etching the semiconductor substrate 101, and a first groove is formed between the fins 104. All of the fins 104 present a strip structure and are parallel to each other.

A second groove is formed in the non-polysilicon gate region 103 that does not comprise the fin 104, wherein the depth of the second groove is the same as the depth of the first groove.

The semiconductor substrate 101 comprises a silicon substrate.

Step 2, as shown in FIG. 1A, a first insulating layer 105 fills the first groove and the second groove.

Step 3, as shown in FIG. 1A, the first insulating layer 105 is fully etched back to define the height of the fin 104.

Step 4, as shown in FIG. 1A, a polysilicon gate 106 is formed, the polysilicon gate 106 filling a top region of the first insulating layer 105 in each first groove and the second groove and extending to the outside of the first groove and the second groove.

Generally, a step of forming a hard mask 107 on the top of the polysilicon gate 106 is further performed after the polysilicon gate 106 is formed. The material of the hard mask 107 comprises an oxide layer or a nitride layer.

A step of forming a gate dielectric layer is further performed before the polysilicon gate 106 is formed, wherein the gate dielectric layer covers side and top surfaces of each fin 104. The gate dielectric layer is an oxide layer; or the gate dielectric layer is a layer with a high dielectric constant.

Step 5, as shown in FIG. 1B, photolithographic process definition is performed to open a polysilicon gate cutting region, and polysilicon etching is performed to fully remove the polysilicon gate 106 in the opened region, so as to achieve cutting of the polysilicon gate 106. As can be seen from FIG. 1B, after the polysilicon etching is performed, the polysilicon gates 106 in the polysilicon gate formation region 102 and on two sides of the non-polysilicon gate region 103 are not connected together, presenting a cutting-off relationship.

Generally, after the polysilicon gate cutting region is opened, the hard mask 107 is etched first, and then the polysilicon is etched by using the hard mask 107 as a mask.

It can be seen from FIG. 1B that, the depth of the polysilicon etching is relatively large, and as the height of the polysilicon gate 106 increases, the depth of the polysilicon etching may increase, in which case the polysilicon etching may have a relatively large depth-to-width ratio, thereby increasing difficulty in etching. In this case, polysilicon etching residues are easy to be formed, for example, in a bottom region of the groove formed by the etching, that is, a region indicated by the dashed line block corresponding to the mark 108, the polysilicon cannot be fully removed, which may incur subsequent component shot-circuit, thereby reducing the product yield.

BRIEF SUMMARY

The technical problem to be solved by the present disclosure is to provide a process method for cutting a polysilicon gate of a FinFET transistor, by which a process window can be enlarged, thereby preventing polysilicon residues generated during cutting etching of the polysilicon gate and preventing yield problems caused by the generation of the polysilicon residues during the cutting etching of the polysilicon gate.

In order to solve the above technical problem, the process method for cutting a polysilicon gate of a FinFET transistor provided by the present disclosure comprises the following steps:

A process method for cutting a polysilicon gate of a FinFET transistor, comprising the following steps:

step 1, providing a semiconductor substrate, the semiconductor substrate comprising a polysilicon gate formation region and a non-polysilicon gate region thereon;

forming a plurality of fins in the polysilicon gate formation region by etching the semiconductor substrate, and forming a first groove between the fins; and forming a second groove in the non-polysilicon gate region that does not comprise the fin, wherein the depth of the second groove is the same as the depth of the first groove;

step 2, filing the first groove and the second groove with a first insulating layer;

step 3, performing definition by using a second photomask opposite to a first photomask that defines a polysilicon gate cutting region, and forming a first mask on the top of the first insulating layer in the second groove;

step 4, performing etching-back of the first insulating layer by using the first mask as a mask, to define the height of the fin, so that a surface of the first insulating layer outside a coverage region of the first mask is located below a top surface of the fin; in the second groove, forming a third groove on two sides of the coverage region of the first mask by means of the etching-back of the first insulating layer, forming a polysilicon etching barrier layer by the first insulating layer between the third grooves; and then removing the first mask;

step 5, forming a polysilicon gate, the polysilicon gate filling a top region of the first insulating layer in each first groove and the third groove and extending to the outside of the first groove and the second groove; and step 6, performing definition by using the first photomask, to open the polysilicon gate cutting region, and performing polysilicon etching to fully remove the polysilicon gate on the top of the polysilicon etching barrier layer, so as to achieve cutting of the polysilicon gate.

A further improvement is that the semiconductor substrate comprises a silicon substrate.

A further improvement is that step 1 further comprises a step of forming a first hard mask on a surface of the fin before an etching process of the fin, a formation region of the first hard mask is defined by a photolithographic process, and an etching region of the etching process of the fin is defined by the first hard mask.

A further improvement is that the first hard mask is formed by a nitride layer or by stacking an oxide layer and a nitride layer.

A further improvement is that in step 2, the first insulating layer is formed by an oxide layer.

A further improvement is that step 2 comprises the following sub-steps:

step 21, depositing the first insulating layer, the first insulating layer filling the first groove and the second groove and extending to an exterior region of the first groove and the second groove;

step 22, polishing the first insulating layer by means of a chemical mechanical polishing process using the first hard mask as an end point, wherein after the polishing, the first insulating layer in the exterior region of the first groove and the second groove is removed, such that the first insulating layer fills only the first groove and the second groove; and step 23, removing the first hard mask.

A further improvement is that in step 3, the material of the first mask comprises a photoresist.

A further improvement is that the material of the first mask further comprises silicon nitride, and the first mask is formed by stacking the silicon nitride and the photoresist.

A further improvement is that in step 3, the first mask is formed by a photoresist.

A further improvement is that step 5 further comprises a step of forming a second hard mask on the top of the polysilicon gate after formation of the polysilicon gate; and in step 6, after the polysilicon gate cutting region is opened, etching of the second hard mask is performed first, and then the polysilicon etching is performed by using the second hard mask as a mask.

A further improvement is that the material of the second hard mask comprises an oxide layer or a nitride layer.

A further improvement is that all of the fins present a strip structure and are parallel to each other.

A further improvement is that step 5 further comprises a step of forming a gate dielectric layer before formation of the polysilicon gate, the gate dielectric layer covering side and top surfaces of each fin.

A further improvement is that the gate dielectric layer is an oxide layer; or the gate dielectric layer is a layer with a high dielectric constant.

A further improvement is that the width of the second groove is greater than the width of the first groove.

A further improvement is that after the etching process of the fin is completed, the fin is further formed in the non-polysilicon gate region, and the method further comprises a step of removing the fin in the non-polysilicon gate region.

In the present disclosure, after the first insulating layer that fills the first groove between the fins in the polysilicon gate formation region and the second groove in the non-polysilicon gate region is formed, the etching-back of the first insulation layer for definition of the height of the fin is not performed directly, while a step of the photolithographic process using the second photomask opposite to the first photomask that defines the polysilicon gate cutting region is added before the etching-back of the first insulating layer, so as to form the first mask in the polysilicon gate cutting region on the top of the first insulating layer in the second groove, and then an etching-back process of the first insulating layer is performed. In this case, after the etching-back of the first insulating layer is completed, the height of the first insulating layer in the polysilicon gate cutting region can be maintained and the first insulating layer can be used as a polysilicon etching barrier layer, and the depth of the subsequent poly silicon gate cutting process, that is, the polysilicon etching in the polysilicon gate cutting region, can be reduced, thereby enlarging the process window of the polysilicon gate cutting process, preventing polysilicon residues generated during cutting etching of the polysilicon gate and preventing yield problems caused by the generation of the polysilicon residues during the cutting etching of the polysilicon gate, and increasing the product yield.

BRIEF DESCRIPTION OF THE DRAWINGS

The disclosure is further expounded below with reference to the accompanying drawings and specific embodiments.

DETAILED DESCRIPTION

Figure 1A:
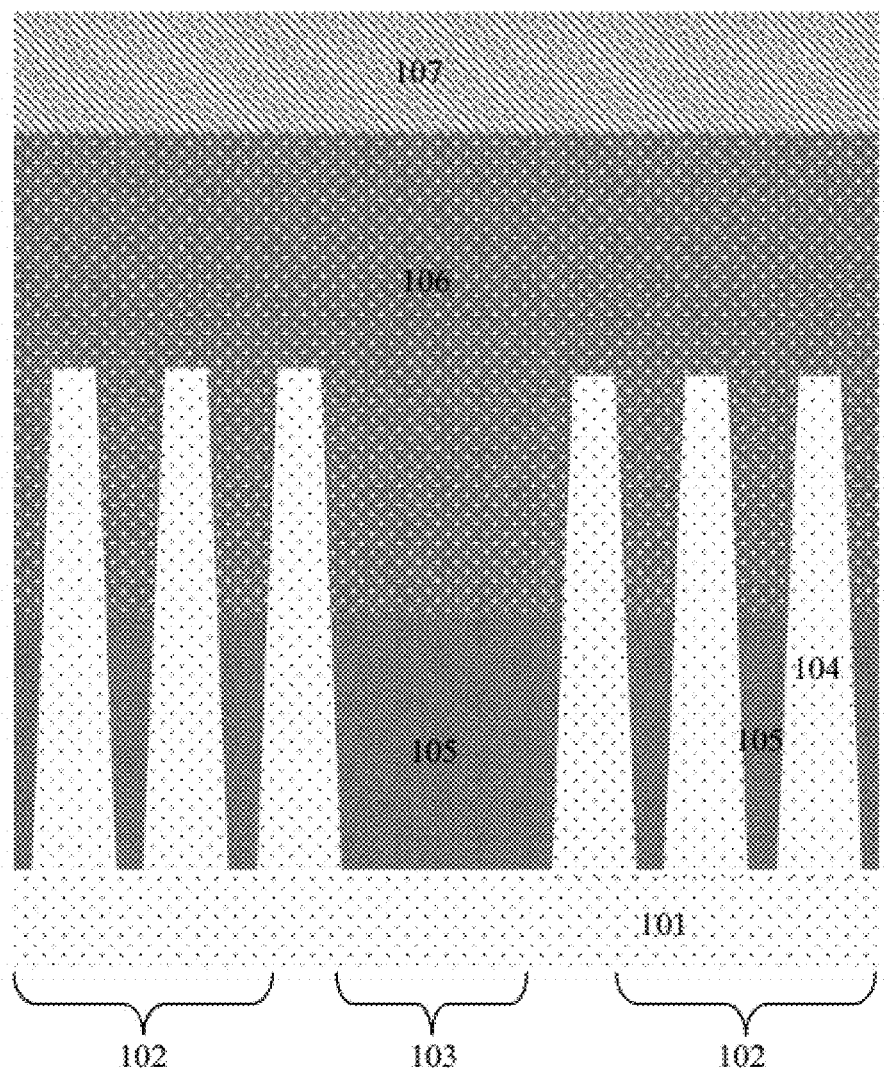
FIGS. 1A and 1B are schematic diagrams of a device structure in each step of an existing process method for cutting a poly silicon gate of a FinFET transistor.
Figure 1B:
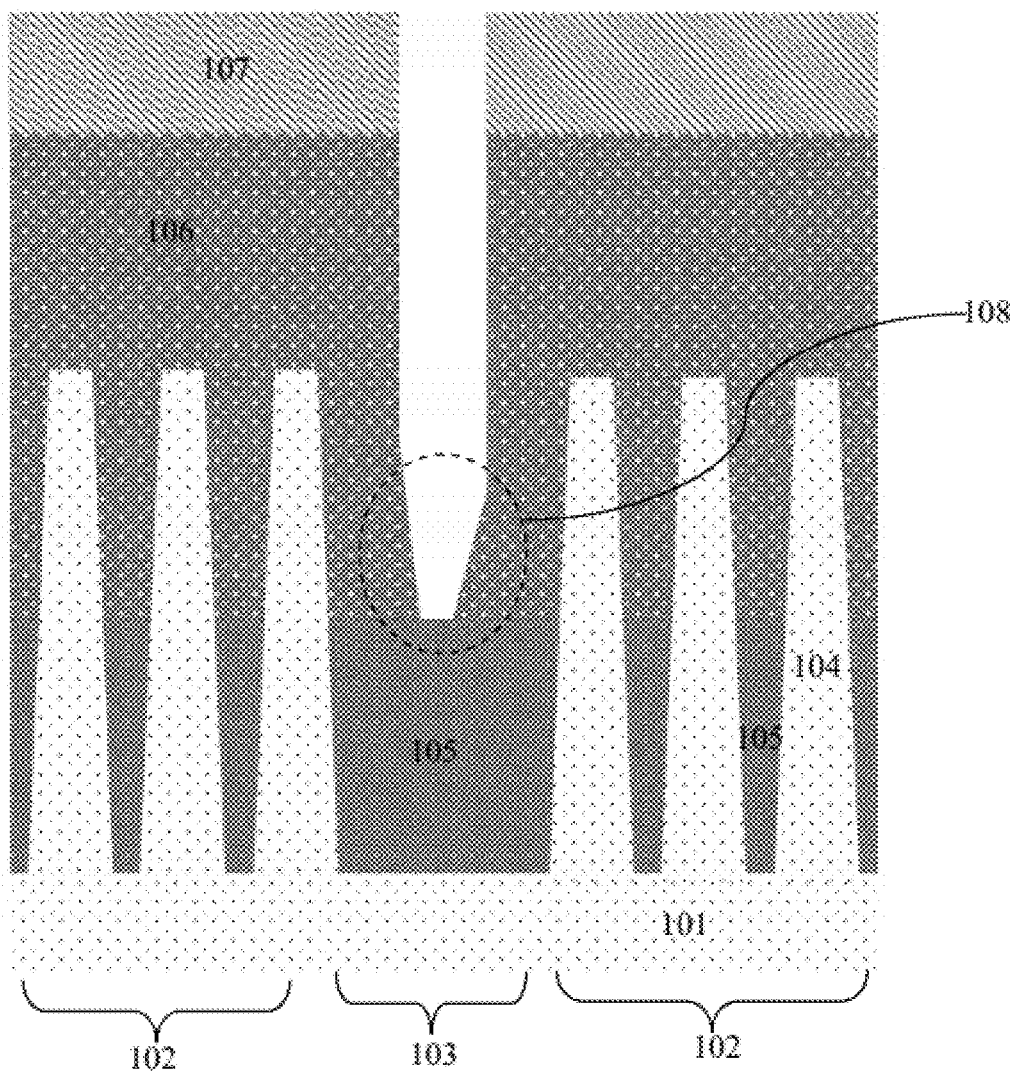
Figure 2:
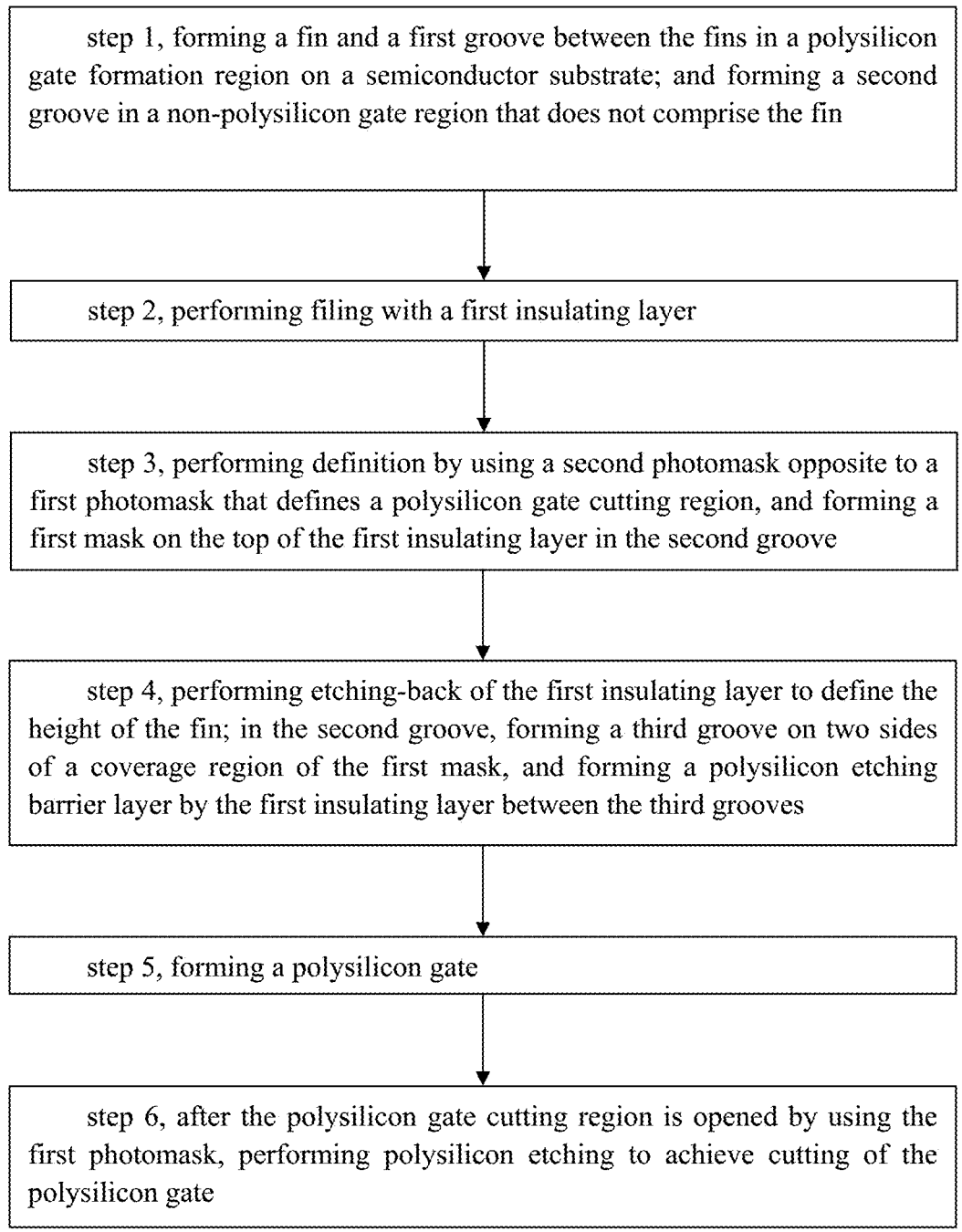
FIG. 2 is a flowchart of a process method for cutting a polysilicon gate of a FinFET transistor in an embodiment of the present disclosure.

FIG. 2 is a flowchart of a process method for cutting a polysilicon gate of a FinFET transistor in an embodiment of the present disclosure. FIGS. 3A-3F are schematic diagrams of a device structure in each step of the process method for cutting a polysilicon gate of a FinFET transistor in the embodiment of the present disclosure. The process method for cutting a polysilicon gate of a FinFET transistor in the embodiment of the present disclosure comprises the following steps.

Figure 3A:
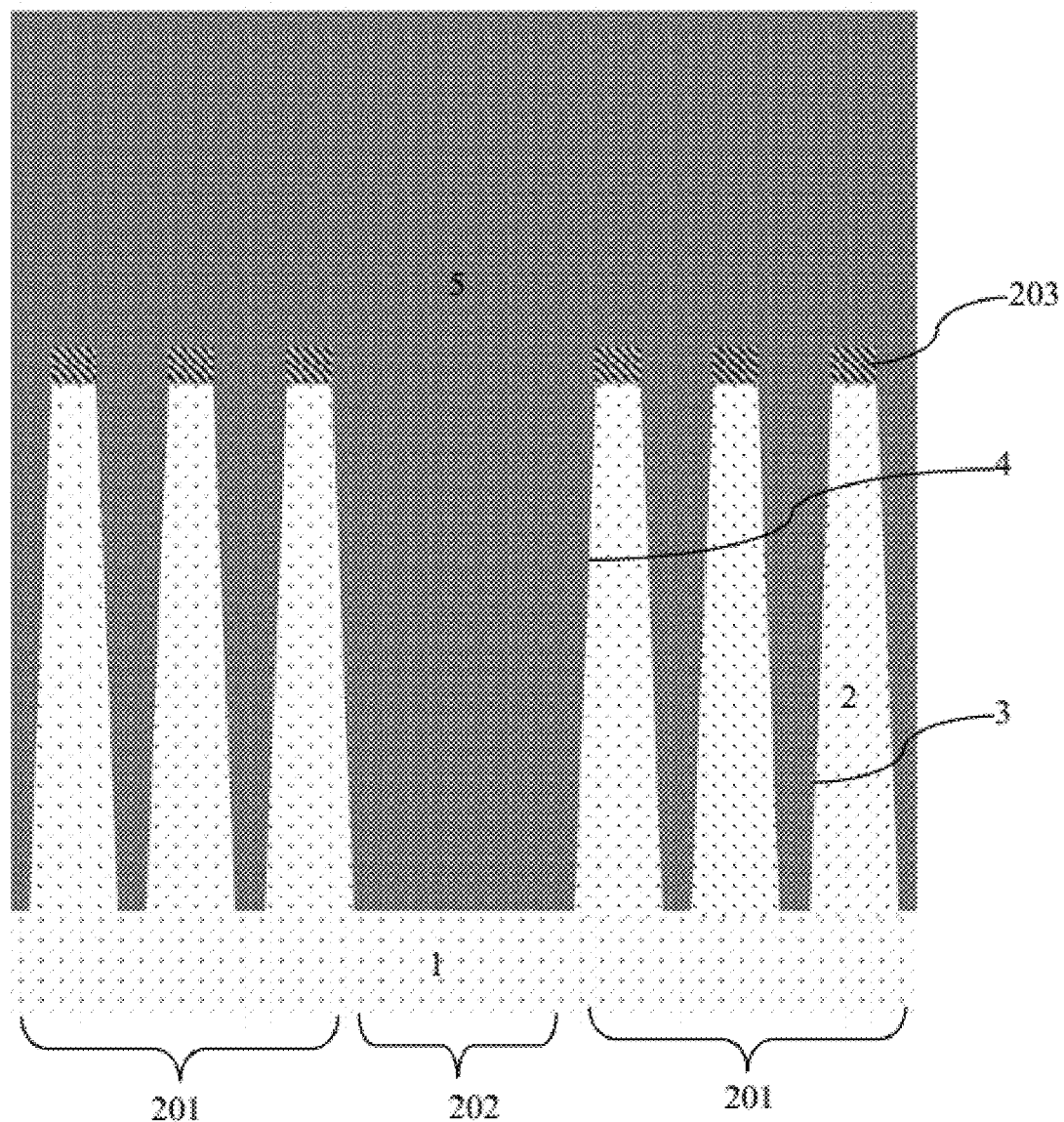
FIGS. 3A-3F are schematic diagrams of a device structure in each step of the process method for cutting a polysilicon gate of a FinFET transistor in the embodiment of the present disclosure.

Step 1, as shown in FIG. 3A, a semiconductor substrate 1 is provided, the semiconductor substrate comprising a polysilicon gate formation region 201 and a non-polysilicon gate region 202 thereon.

A plurality of fins 2 are formed in the polysilicon gate formation region 201 by etching the semiconductor substrate 1, and a first groove 3 is formed between the fins 2. All of the fins 2 present a strip structure and are parallel to each other.

A second groove 4 is formed in the non-polysilicon gate region 202 that does not comprise the fin 2, wherein the depth of the second groove 4 is the same as the depth of the first groove 3.

The semiconductor substrate 1 comprises a silicon substrate.

Step 1 further comprises a step of forming a first hard mask 203 on a surface of the fin 2 before an etching process of the fin 2, a formation region of the first hard mask 203 is defined by a photolithographic process, and an etching region of the etching process of the fin 2 is defined by the first hard mask 203.

The first hard mask 203 is formed by a nitride layer or by stacking an oxide layer and a nitride layer.

The width of the second groove 4 is greater than the width of the first groove 3.

Preferably, after the etching process of the fin 2 is completed, the fin 2 is further formed in the non-polysilicon gate region 202, and the method further comprises a step of removing the fin 2 in the non-polysilicon gate region 202.

Figure 3B:
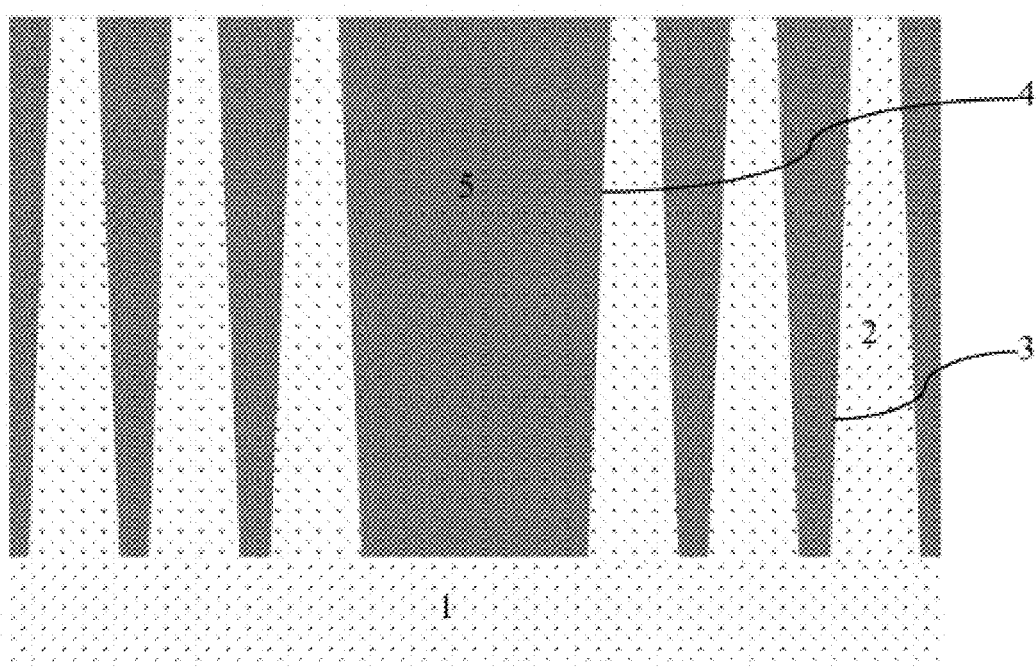

Step 2, as shown in FIG. 3B, a first insulating layer 5 fills the first groove 3 and the second groove 4.

The first insulating layer 5 is formed by an oxide layer.

Step 2 comprises the following sub-steps:

step 21, as shown in FIG. 3A, the first insulating layer 5 is deposited, the first insulating layer filling the first groove 3 and the second groove 4 and extending to an exterior region of the first groove 3 and the second groove 4;

step 22, as shown in FIG. 3B, the first insulating layer 5 is polished by means of a chemical mechanical polishing process using the first hard mask 203 as an end point, wherein after the polishing, the first insulating layer 5 in the exterior region of the first groove 3 and the second groove 4 is removed, such that the first insulating layer 5 fills only the first groove 3 and the second groove 4; and step 23, as shown in FIG. 3B, the first hard mask 203 is removed.

Figure 3C:
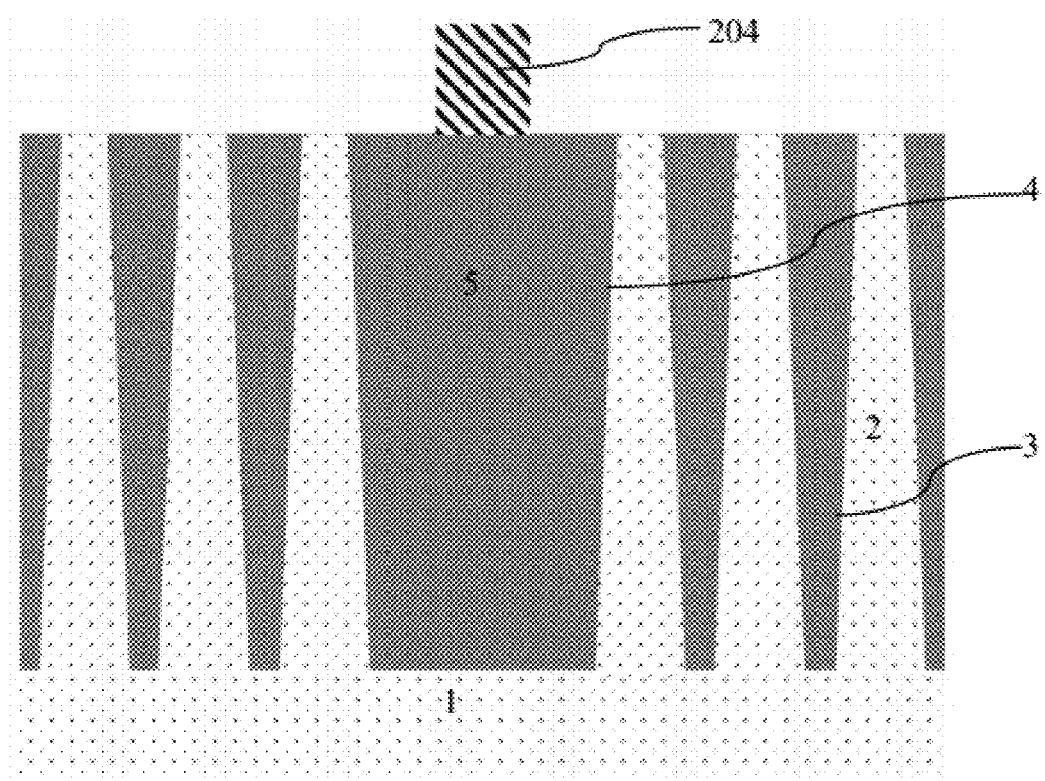

Step 3, as shown in FIG. 3C, definition is performed by using a second photomask opposite to a first photomask that defines a polysilicon gate cutting region, and a first mask 204 is formed on the top of the first insulating layer 5 in the second groove 4.

The material of the first mask 204 comprises a photoresist. In other embodiments, the first mask 204 may be formed by stacking silicon nitride and the photoresist.

Figure 3D:
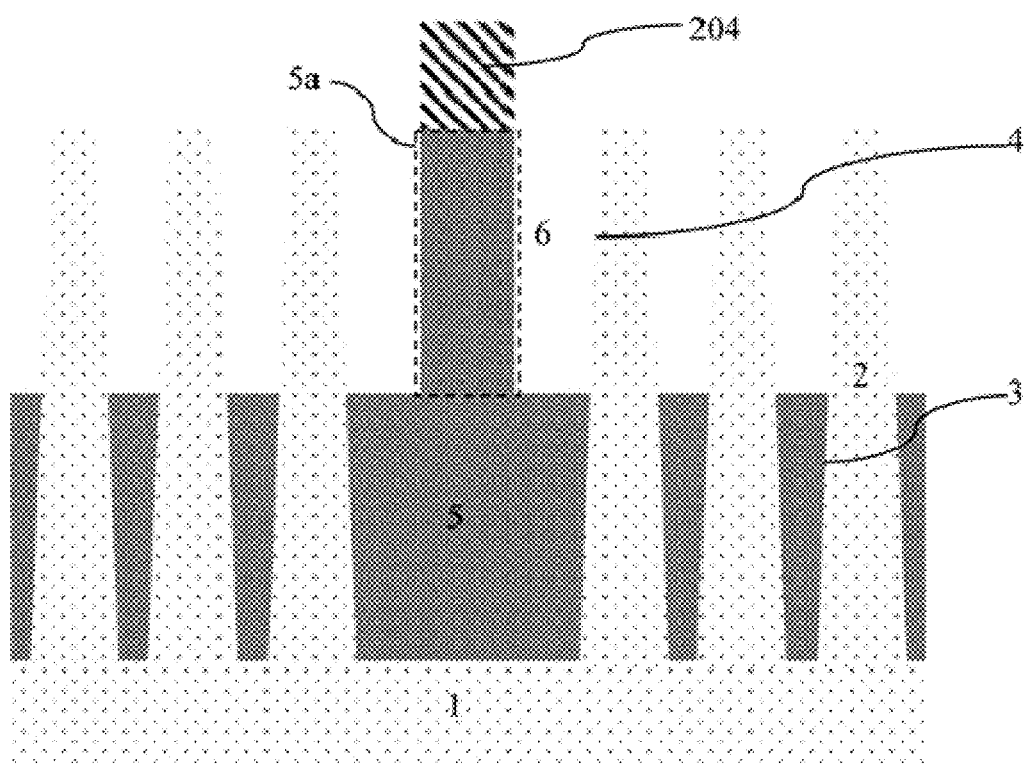

Step 4, as shown in FIG. 3D, etching-back of the first insulating layer 5 is performed by using the first mask 204 as a mask, to define the height of the fin 2, so that a surface of the first insulating layer 5 outside a coverage region of the first mask 204 is located below a top surface of the fin 2; in the second groove 4, a third groove 6 is formed on two sides of the coverage region of the first mask 204 by means of the etching-back of the first insulating layer 5, a polysilicon etching barrier layer 5a is formed by the first insulating layer 5 between the third grooves 6; and then the first mask 204 is removed.

Figure 3E:
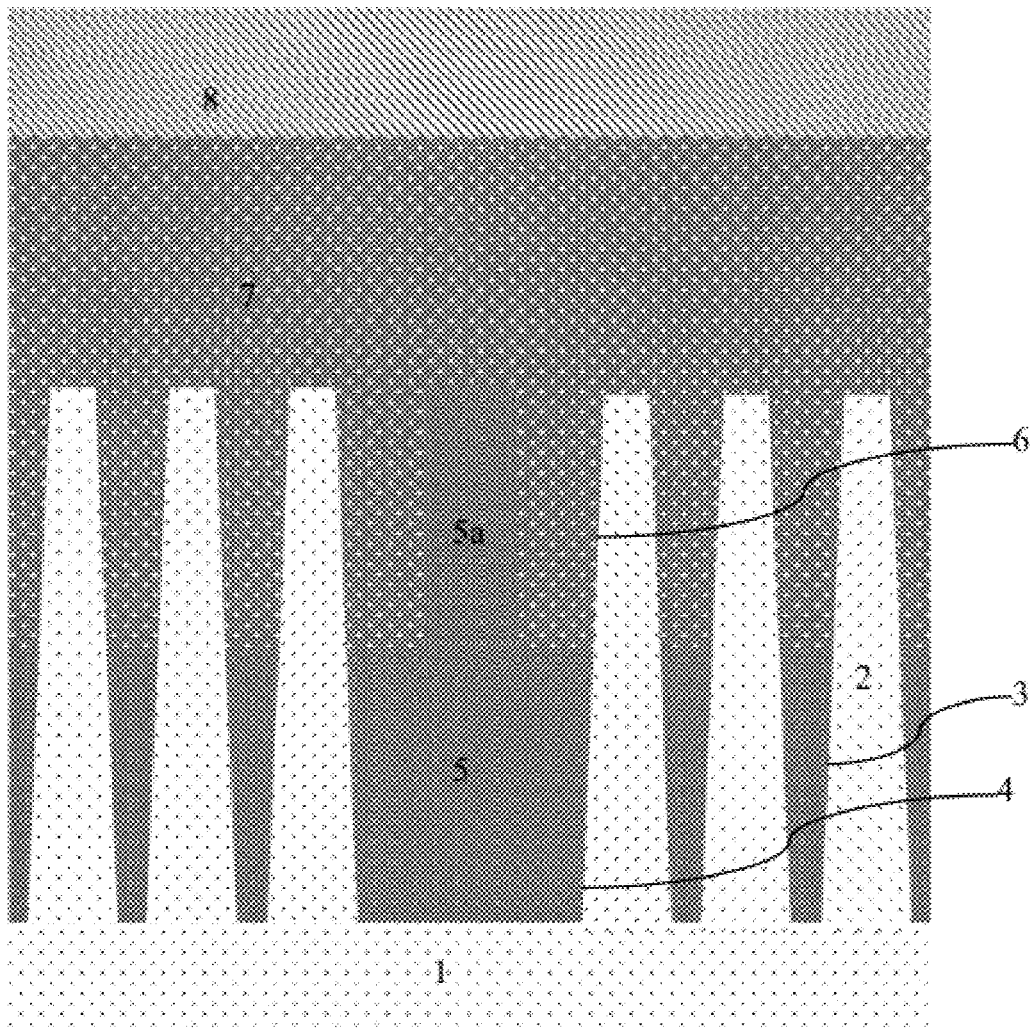

Step 5, as shown in FIG. 3E, a polysilicon gate 7 is formed, the polysilicon gate filling a top region of the first insulating layer 5 in each first groove 3 and the third groove 6 and extending to the outside of the first groove 3 and the second groove 4.

In this embodiment of the present disclosure, step 5 further comprises a step of forming a second hard mask 8 on the top of the polysilicon gate 7 after formation of the polysilicon gate 7. The material of the second hard mask 8 comprises an oxide layer or a nitride layer.

Step 5 further comprises a step of forming a gate dielectric layer before formation of the polysilicon gate 7, the gate dielectric layer covering side and top surfaces of each fin 2. The gate dielectric layer is an oxide layer; or the gate dielectric layer is a layer with a high dielectric constant.

Figure 3F:
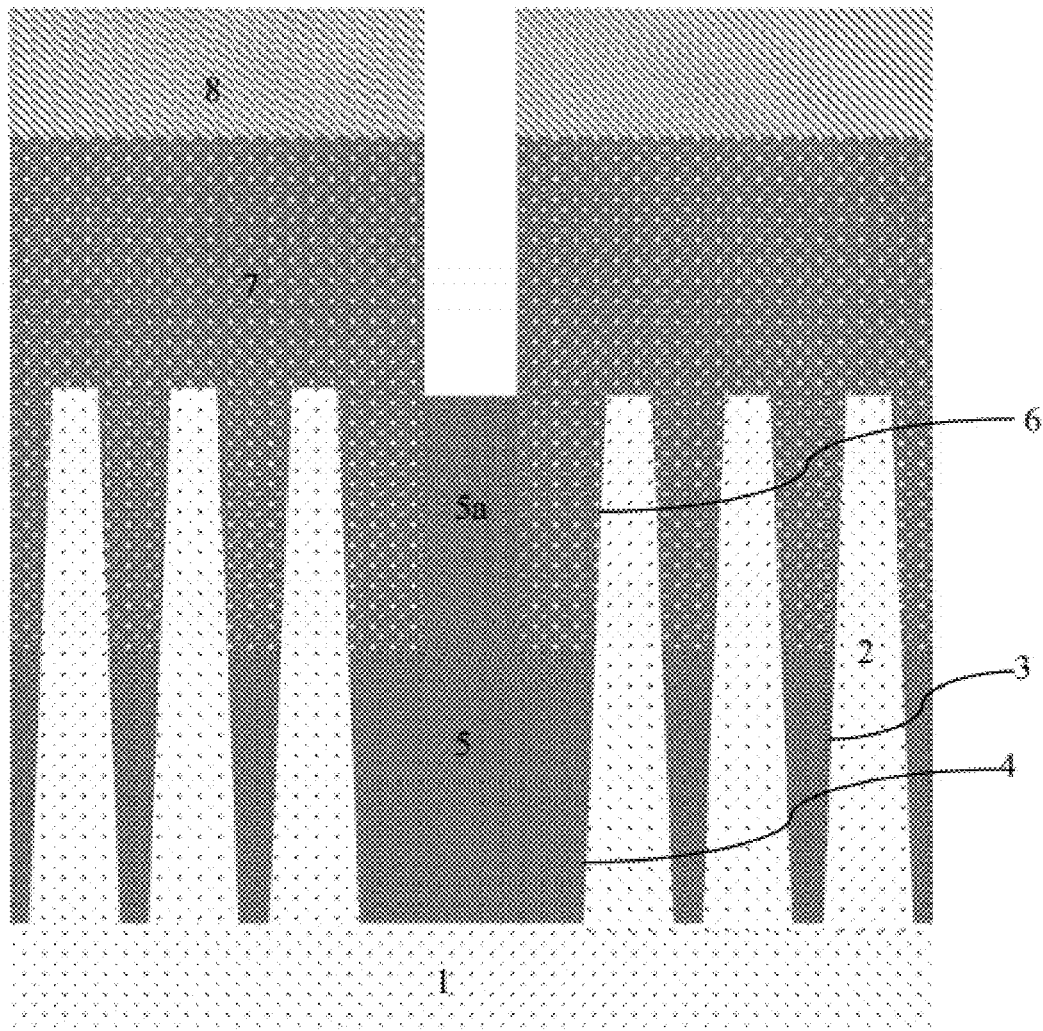

Step 6, as shown in FIG. 3F, definition is performed by using the first photomask, to open the polysilicon gate cutting region, and polysilicon etching is performed to fully remove the polysilicon gate 7 on the top of the polysilicon etching barrier layer 5a, so as to achieve cutting of the polysilicon gate 7. As can be seen from FIG. 3F, after the polysilicon etching is performed, the polysilicon gates 7 in the polysilicon gate formation region 201 and on two sides of the non-polysilicon gate region 202 are not connected together, presenting a cutting-off relationship.

In this embodiment of the present disclosure, after the polysilicon gate cutting region is opened, etching of the second hard mask 8 is performed first, and then the polysilicon etching is performed by using the second hard mask 8 as a mask.

In the embodiment of the present disclosure, after the first insulating layer 5 that fills the first groove 3 between the fins 2 in the polysilicon gate formation region 201 and the second groove 4 in the non-polysilicon gate region 202 is formed, the etching-back of the first insulation layer 5 for definition of the height of the fin 2 is not performed directly, while a step of the photolithographic process using the second photomask opposite to the first photomask that defines the polysilicon gate cutting region is added before the etching-back of the first insulating layer 5, so as to form the first mask 204 in the polysilicon gate cutting region on the top of the first insulating layer 5 in the second groove 4, and then an etching-back process of the first insulating layer 5 is performed. In this case, after the etching-back of the first insulating layer 5 is completed, the height of the first insulating layer 5 in the polysilicon gate cutting region can be maintained and the first insulating layer 5 can be used as a polysilicon etching barrier layer 5a, and the depth of the subsequent polysilicon gate cutting process, that is, the polysilicon etching in the polysilicon gate cutting region, can be reduced, thereby enlarging the process window of the polysilicon gate cutting process, preventing polysilicon residues generated during cutting etching of the polysilicon gate and preventing yield problems caused by the generation of the polysilicon residues during the cutting etching of the polysilicon gate, and increasing the product yield.

The present disclosure is expounded above with reference to the specific embodiments, but these embodiments are not intended to limit the disclosure. Various transformations and improvements made by those skilled in this field without deviating from the principle of the present disclosure should also fall within the protection scope of the present disclosure.

What is claimed is:

1. A process method for cutting a polysilicon gate of a FinFET transistor, comprising the following steps:

step 1, providing a semiconductor substrate, the semiconductor substrate comprising a polysilicon gate formation region and a non-polysilicon gate region thereon;

forming a plurality of fins in the polysilicon gate formation region by etching the semiconductor substrate, and forming first grooves between the fins; and forming a second groove in the non-polysilicon gate region that does not comprise the fins, wherein a depth of the second groove is the same as a depth of the first grooves;

step 2, filling the first grooves and the second groove with a first insulating layer;

step 3, performing definition by using a second photomask opposite to a first photomask that defines a polysilicon gate cutting region, and forming a first mask on the top of the first insulating layer in the second groove;

step 4, performing etching-back of the first insulating layer by using the first mask as a mask, to define a height of the fins, so that a surface of the first insulating layer outside a coverage region of the first mask is located below a top surface of the fins; in the second groove, forming third grooves on two sides of the coverage region of the first mask by means of the etching-back of the first insulating layer, forming a polysilicon etching barrier layer by the first insulating layer between the third grooves; and then removing the first mask;

step 5, forming a polysilicon gate, the polysilicon gate filling a top region of the first insulating layer in each of the first grooves and the third grooves and extending to the outside of the first grooves and the second groove; and step 6, performing definition by using the first photomask, to open the polysilicon gate cutting region, and performing polysilicon etching to fully remove the polysilicon gate on the top of the polysilicon etching barrier layer, so as to achieve cutting of the polysilicon gate.

2. The process method for cutting the polysilicon gate of the FinFET transistor according to claim 1, wherein the semiconductor substrate comprises a silicon substrate.

3. The process method for cutting the polysilicon gate of the FinFET transistor according to claim 1, wherein step 1 further comprises a step of forming a first hard mask on a surface of the fins before an etching process of the fins, a formation region of the first hard mask being defined by a photolithographic process, and an etching region of the etching process of the fins being defined by the first hard mask.

4. The process method for cutting the polysilicon gate of the FinFET transistor according to claim 3, wherein the first hard mask is formed by a nitride layer or by stacking an oxide layer and a nitride layer.

5. The process method for cutting the polysilicon gate of the FinFET transistor according to claim 4, wherein in step 2, the first insulating layer is formed by an oxide layer.

6. The process method for cutting the polysilicon gate of the FinFET transistor according to claim 5, wherein step 2 comprises the following sub-steps:

step 21, depositing the first insulating layer, the first insulating layer filling the first grooves and the second groove and extending to an exterior region of the first grooves and the second groove;

step 22, polishing the first insulating layer by means of a chemical mechanical polishing process using the first hard mask as an end point, wherein after the polishing, the first insulating layer in the exterior region of the first grooves and the second groove is removed, such that the first insulating layer fills only the first grooves and the second groove; and step 23, removing the first hard mask.

7. The process method for cutting the polysilicon gate of the FinFET transistor according to claim 1, wherein in step 3, a material of the first mask comprises a photoresist.

8. The process method for cutting the polysilicon gate of the FinFET transistor according to claim 7, wherein the material of the first mask further comprises silicon nitride, and the first mask is formed by stacking the silicon nitride and the photoresist.

9. The process method for cutting the polysilicon gate of the FinFET transistor according to claim 1, wherein step 5 further comprises a step of forming a second hard mask on the top of the polysilicon gate after formation of the polysilicon gate; and in step 6, after the polysilicon gate cutting region is opened, etching of the second hard mask is performed first, and then the polysilicon etching is performed by using the second hard mask as a mask.

10. The process method for cutting the polysilicon gate of the FinFET transistor according to claim 9, wherein a material of the second hard mask comprises an oxide layer or a nitride layer.

11. The process method for cutting the polysilicon gate of the FinFET transistor according to claim 1, wherein all of the fins present a strip structure and are parallel to each other.

12. The process method for cutting the polysilicon gate of the FinFET transistor according to claim 1, wherein step 5 further comprises a step of forming a gate dielectric layer before the forming the polysilicon gate, the gate dielectric layer covering side and top surfaces of each fin.

13. The process method for cutting the polysilicon gate of the FinFET transistor according to claim 12, wherein the gate dielectric layer is an oxide layer; or the gate dielectric layer is a layer with a high dielectric constant.

14. The process method for cutting the polysilicon gate of the FinFET transistor according to claim 1, wherein a width of the second groove is greater than a width of the first grooves.

15. The process method for cutting the polysilicon gate of the FinFET transistor according to claim 14, wherein after an etching process of the fins is completed, a fin is further formed in the non-polysilicon gate region, and the method further comprises a step of removing the fin in the non-polysilicon gate region.

* * * * *